United States Patent [19]

Foster et al.

[11] Patent Number: 5,628,829

[45] Date of Patent: May 13, 1997

[54] METHOD AND APPARATUS FOR LOW TEMPERATURE DEPOSITION OF CVD AND PECVD FILMS

[75] Inventors: Robert F. Foster, Phoenix; Joseph T. Hillman, Scottsdale; Rikhit Arora, Mesa, all of Ariz.

[73] Assignee: Materials Research Corporation, Gilbert, Ariz.

[21] Appl. No.: 253,714

[22] Filed: Jun. 3, 1994

[51] Int. Cl.⁶ .................................................. C23C 16/00
[52] U.S. Cl. .................. 118/723 E; 118/730; 118/725
[58] Field of Search .................................. 118/715, 725, 118/723 E, 730

[56] References Cited

U.S. PATENT DOCUMENTS

| 4,138,306 | 2/1979 | Niwa. |
| 4,151,325 | 4/1979 | Welch. |
| 4,178,877 | 12/1979 | Kudo. |
| 4,282,267 | 8/1981 | Kuyel. |
| 4,352,834 | 10/1982 | Taketoshi et al.. |

(List continued on next page.)

FOREIGN PATENT DOCUMENTS

| 254654A1 | 1/1988 | European Pat. Off.. |
| 0359264 | 3/1990 | European Pat. Off.. |
| 545460A2 | 6/1993 | European Pat. Off.. |
| 4016765 | 11/1991 | Germany. |
| 53-91664 | 8/1978 | Japan. |
| 60-98629 | 6/1985 | Japan .................................. 156/345 |
| 60-116126 | 6/1985 | Japan .................................. 118/728 |
| 61-41763 | 2/1986 | Japan. |
| 63-187619 | 8/1988 | Japan .................................. 118/723 |
| 3-80537 | 4/1991 | Japan. |
| 2181458 | 4/1987 | United Kingdom. |
| 2192196 | 1/1988 | United Kingdom. |
| 2245600 | 1/1992 | United Kingdom. |
| WO90/04044 | 4/1990 | WIPO. |
| WO93/25722 | 12/1993 | WIPO. |

OTHER PUBLICATIONS

Kodama Atsushi; others, "Thin Film Forming Device" Abstracts of Japan, JP2217475, vol. 14, No. 522, 1990.

Kondo Hidekazu; others, "Method and Device for Forming Metallic Wiring" Abstracts of Japan, JP6158320, vol. 18, No. 490, 1994.

Kato Isamu; others, "Formation of Amorphous Silicon Film" Abstracts of Japan, JP2085368, vol. 14, No. 280, 1990.

Hirano Makoto, "Surface Treatment of Ornamental Parts" Abstracts of Japan, JP62161951, vol. 12, No. 5, 1988.

Pawlak & Zyrnicki, "Spectroscopic Investigations into Plasma Used for Nitriding Processes of Steel and Titanium", Thin Solid Films, 230.

(List continued on next page.)

Primary Examiner—Richard Bueker
Attorney, Agent, or Firm—Wood, Herron & Evans

[57] ABSTRACT

Method and apparatus are disclosed for low temperature deposition of CVD and PECVD films utilizing a gas-dispersing showerhead position within one inch of a rotating substrate. The showerhead is positioned a suitable distance below a gas-dispensing apparatus such as a steady stay flow of gas develops between the ring and showerhead. A cylindrical structure extends between the gas-dispersing ring and a showerhead to contain the gas over the showerhead yielding a small boundary layer over the substrate to ensure efficient uniform deposition of a film on a substrate surface. In the one embodiment of the present invention the showerhead is bias with RF energy such that it acts as an electrode to incite a plasma proximate with the substrate for PECVD. The cylinder is isolated from the showerhead such as by a quartz insulator ring to prevent ignition of a plasma within the cylinder, or alternatively, the cylinder is fabricated of zquartz material. The RF showerhead utilizes small gas-dispersing holes to further prevent ignition of a plasma within the cylinder. The very small showerhead-to-substrate spacing and the efficient delivery of the plasma and reacting gases produces low temperature CVD and PECVD of films on the substrate.

20 Claims, 6 Drawing Sheets

U.S. PATENT DOCUMENTS

| | | | |
|---|---|---|---|
| 4,365,587 | 12/1982 | Hirose et al. | |
| 4,366,208 | 12/1982 | Akai et al. | |
| 4,410,758 | 10/1983 | Grolitzer. | |
| 4,504,518 | 3/1985 | Ovshinsky et al. | |
| 4,532,199 | 7/1985 | Ueno et al. | |
| 4,535,000 | 8/1985 | Gordon. | |
| 4,557,943 | 12/1985 | Rosler et al. | |
| 4,657,774 | 4/1987 | Satou et al. | |
| 4,678,679 | 7/1987 | Ovshinsky. | |
| 4,689,093 | 8/1987 | Ishihara et al. | |
| 4,702,934 | 10/1987 | Ishihara et al. | |
| 4,716,048 | 12/1987 | Ishihara et al. | |
| 4,717,584 | 1/1988 | Aoki et al. | |
| 4,717,585 | 1/1988 | Ishihara et al. | |
| 4,717,586 | 1/1988 | Ishihara et al. | |
| 4,718,976 | 1/1988 | Fujimura. | |
| 4,726,963 | 2/1988 | Ishihara et al. | |
| 4,728,528 | 3/1988 | Ishihara et al. | |
| 4,759,947 | 7/1988 | Ishihara et al. | |
| 4,772,486 | 9/1988 | Ishihara et al. | |
| 4,774,195 | 9/1988 | Beneking. | |
| 4,778,692 | 10/1988 | Ishihara et al. | |
| 4,784,874 | 11/1988 | Ishihara et al. | |
| 4,792,378 | 12/1988 | Rose et al. | 156/643.1 |
| 4,798,165 | 1/1989 | deBoer et al. | 118/225 |
| 4,801,468 | 1/1989 | Ishihara et al. | |
| 4,803,093 | 2/1989 | Ishihara et al. | |
| 4,818,560 | 4/1989 | Ishihara et al. | |
| 4,818,563 | 4/1989 | Ishihara et al. | |
| 4,835,005 | 5/1989 | Hirooka et al. | |
| 4,844,950 | 7/1989 | Saitoh et al. | |
| 4,851,302 | 7/1989 | Nakagawa et al. | |
| 4,853,251 | 8/1989 | Ishihara et al. | |
| 4,869,923 | 9/1989 | Yamazaki. | |
| 4,869,924 | 9/1989 | Ito. | |
| 4,870,030 | 9/1989 | Markunas et al. | |
| 4,876,983 | 10/1989 | Fukuda et al. | |
| 4,885,067 | 12/1989 | Doty. | |
| 4,886,683 | 12/1989 | Hoke et al. | |
| 4,888,062 | 12/1989 | Nakagawa et al. | |
| 4,888,088 | 12/1989 | Slomowitz. | |
| 4,897,709 | 1/1990 | Yokoyama et al. | |
| 4,898,118 | 2/1990 | Murakami et al. | |
| 4,900,694 | 2/1990 | Nakagawa. | |
| 4,908,329 | 3/1990 | Kanai et al. | |
| 4,908,330 | 3/1990 | Arai et al. | |
| 4,913,929 | 4/1990 | Moslehi et al. | |
| 4,914,052 | 4/1990 | Kanai. | |
| 4,926,229 | 5/1990 | Nakagawa et al. | |
| 4,927,786 | 5/1990 | Nishida. | |
| 4,937,094 | 6/1990 | Doehler et al. | |
| 4,946,514 | 8/1990 | Nakagawa et al. | |
| 4,951,602 | 8/1990 | Kanai. | |
| 4,954,397 | 9/1990 | Amada et al. | |
| 4,957,772 | 9/1990 | Saitoh et al. | |
| 4,959,106 | 9/1990 | Nakagawa et al. | |
| 4,971,832 | 11/1990 | Arai et al. | |
| 4,977,106 | 12/1990 | Smith. | |
| 4,987,856 | 1/1991 | Hey et al. | |
| 4,992,305 | 2/1991 | Erbil. | |
| 4,992,839 | 2/1991 | Shirai. | |
| 4,998,503 | 3/1991 | Murakami et al. | |
| 5,000,113 | 3/1991 | Wang et al. | |
| 5,002,617 | 3/1991 | Kanai et al. | |
| 5,002,618 | 3/1991 | Kanai et al. | |
| 5,002,793 | 3/1991 | Arai. | |
| 5,002,796 | 3/1991 | Nishida. | |
| 5,006,180 | 4/1991 | Kanai et al. | |
| 5,007,971 | 4/1991 | Kanai et al. | |
| 5,008,726 | 4/1991 | Nakagawa et al. | |
| 5,010,842 | 4/1991 | Oda et al. | |
| 5,018,479 | 5/1991 | Markunas et al. | |
| 5,024,706 | 6/1991 | Kanai et al. | |
| 5,028,488 | 7/1991 | Nakagawa et al. | |
| 5,030,475 | 7/1991 | Ackermann et al. | |
| 5,037,666 | 8/1991 | Mori. | |
| 5,039,354 | 8/1991 | Nakagawa et al. | |
| 5,052,339 | 10/1991 | Vakerlis et al. | |
| 5,061,511 | 10/1991 | Saitoh et al. | |
| 5,073,232 | 12/1991 | Ohmi et al. | |
| 5,085,885 | 2/1992 | Foley et al. | |
| 5,087,542 | 2/1992 | Yamazaki et al. | |
| 5,093,149 | 3/1992 | Doehler et al. | |
| 5,093,150 | 3/1992 | Someno et al. | |
| 5,099,790 | 3/1992 | Kawakami. | |
| 5,100,495 | 3/1992 | Ohmi et al. | |
| 5,122,431 | 6/1992 | Kodama et al. | |
| 5,126,169 | 6/1992 | Ishihara et al. | |
| 5,130,170 | 7/1992 | Kanai et al. | |
| 5,139,825 | 8/1992 | Gordon et al. | |
| 5,151,296 | 9/1992 | Tokunaga. | |
| 5,154,135 | 10/1992 | Ishihara. | |
| 5,173,327 | 12/1992 | Sandhu et al. | |
| 5,175,017 | 12/1992 | Kobayashi et al. | |
| 5,178,904 | 1/1993 | Ichihara et al. | |
| 5,178,905 | 1/1993 | Kanai et al. | |
| 5,180,435 | 1/1993 | Markunas | 118/723 |
| 5,192,370 | 3/1993 | Oda | 118/723 |
| 5,213,997 | 5/1993 | Ishihara et al. | |
| 5,220,181 | 6/1993 | Kanai et al. | |
| 5,246,881 | 9/1993 | Sandhu et al. | |
| 5,260,236 | 11/1993 | Petro et al. | |
| 5,268,034 | 12/1993 | Vukelic | 118/725 |
| 5,273,588 | 12/1993 | Foster | 118/715 |
| 5,279,857 | 1/1994 | Eichman et al. | |
| 5,296,404 | 3/1994 | Akahori et al. | |
| 5,308,655 | 5/1994 | Eichman et al. | |
| 5,318,654 | 6/1994 | Maruyama | 156/345 |
| 5,342,471 | 8/1994 | Fukusawa | 118/723 E |
| 5,342,652 | 8/1994 | Foster et al. | |
| 5,356,476 | 10/1994 | Foster et al. | 118/720 |
| 5,370,739 | 12/1994 | Foster et al. | |
| 5,378,501 | 1/1995 | Foster et al. | 427/255.2 |
| 5,416,045 | 5/1995 | Kauffman et al. | |
| 5,433,787 | 7/1995 | Suzuki et al. | 118/723 ME |
| 5,434,110 | 7/1995 | Foster et al. | 437/245 |
| 5,443,647 | 8/1995 | Aucoin | 118/723 ME |
| 5,453,124 | 9/1995 | Moslehi | 118/715 |

OTHER PUBLICATIONS

Shigenobu Shirai, "Production of Insulating Film" Abstract, JP60204880, vol. 10, No. 67, Mar. 15, 1986.

Sun et al., "Formation of TN and SiO2 by Rapid Processing Using a Large Area Electron Beam", Jrnl of Vacuum Science&Tech.

Suzuki et al., "Planarized Deposition of High–Qualty Silicon Dioxide Film by Photoassisted Plasma CVD at 300 C Using Tetraethyl Orthosilicate" 362 Jap Jrnl of Applied Physics 29(1990)Dec,#12, Tokyo, JP.

Hilton et al., "Comp. Morph&Mech Prop of Plasma–Assisted Chemically Vapor–Dep tiN Films on M2 Tool Steel Metallurgical and Protective Coatings", Thin Solid Films 139(1986)247–260.

METHOD AND APPARATUS FOR LOW TEMPERATURE DEPOSITION OF CVD AND PECVD FILMS

FIELD OF THE INVENTION

This invention relates to chemical vapor deposition and specifically to methods and apparatuses which utilize a unique arrangement between a gas-dispensing showerhead and a rotating susceptor for more efficient gas utilization and more concentrated plasmas. More specifically, the methods and apparatuses are particularly useful for depositing CVD films containing titanium.

BACKGROUND OF THE INVENTION

Chemical vapor deposition, or CVD is a commonly used technique for applying material films or layers to a substrate in the formation of integrated circuits. CVD comprises introducing various reactant gases into a deposition chamber housing a substrate. The reactant gases mix proximate the substrate and chemically react at the surface of the substrate. One or more reactant products from the chemical reactions deposit upon the substrate surface and form a film.

One form of CVD is plasma-enhanced chemical vapor deposition or PECVD. In PECVD, one or more of the reactant gases are excited into a plasma such as by being exposed to RF or microwave electrical energy. The plasma includes various activated particles of the gas or gases. The excited plasma is mixed with other reactant gases, and the plasma supplies energy to the chemical reaction between the various gases to deposit a film on a substrate.

As may be appreciated, the flow of the reactant gases to the substrate surface and to the plasma is important to ensure proper deposition of films in both CVD and PECVD. Preferably, the flow of the plasma gases to the excited plasma in PECVD, in addition to the flow of the other reactant gases to the substrate surface are uniform to promote uniform deposition of the desired film.

In some CVD techniques, the reactant gases are introduced at predetermined flow rates and evacuated at similar rates to ensure that the reactants are propelled in sufficient densities to react and form the desired film. Generally, the reactant gases are introduced above a substrate, such as by a gas ring or halo, and travel downwardly to the substrate at predetermined flow rates. Upon reaching the substrate, the gases mix and react to form a film and any remaining gases are exhausted such as by a vacuum system. In such CVD techniques, there is usually a stagnant layer between the gas flow of the mixed reactant gases and the substrate surface where very small densities of reactants are present. Such a stagnant layer is referred to as a boundary layer. When the boundary layer is large, an undesirable amount of the reactant gases may bypass the substrate and be exhausted from the reaction chamber without reacting. This is wasteful, and therefore costly. It is preferable to have a boundary layer as thin and flat as possible so that a useful density of the gas reactants used in the chemical reaction are available at the substrate surface and do not bypass the substrate to be exhausted, unreacted, out of the chamber.

One way of achieving a thin boundary layer at the substrate is to introduce the reactant gases under matched flow conditions. Matched flow of reactant gases is achieved when the outward volume of gas flowing parallel to and over the flat surface of the substrate is approximately the same as the input volume of gas flowing generally downward and perpendicular to the substrate surface. With low gas flow rates, matched flow can usually be readily achieved; however, with higher gas flow rates, the reactant gases at the substrate do not flow outwardly over the surface of the substrate rapidly enough, and hence, turbulence and backflow of the downward gas flow results.

One alternative for reducing such backflow and turbulence at increased input gas flow rates is to rotate the substrate on a rotating susceptor. An example of a suitable rotating susceptor is utilized within the Rotating Disk Reactor available from Materials Research Corporation (MRC) of Phoenix, Ariz. A rotating susceptor spins the substrate and creates a downward and outward pumping action which draws the reactant gases to the surface of the substrate and outwardly over the surface. The pumping action creates a more rapid outward flow of the gases over the substrate to allow a higher downward gas flow rate without backflow and turbulence. Preferably, the wafer is rotated at a speed which achieves matched flow, i.e., where the downward flow rate is equal to the outward flow rate. Matched reactant gas flow using a rotating susceptor ensures that a suitably thin boundary layer of reactant gas is present for uniform deposition of a film.

While the use of a rotating susceptor allows greater gas input flow rates, it has generally been found that the velocity profile of the reactant gases pumped by the susceptor should be fully developed before the gases reach the rotating substrate surface in order to obtain a uniform flow over the substrate and thus uniform deposition on the substrate. That is, the velocity of the incoming gas flow as measured across the flow path should reach a steady state. To achieve a steady state flow using currently available CVD apparatuses at useful deposition pressures (e.g. from 1 to 100 Torr), it has been necessary to space the gas ring and gas-dispersing showerhead or other gas input device around four (4) inches or more from the surface of the rotating substrate. While enhancing the steady state flow of the gas at the substrate, such a large spacing is not without its drawbacks.

One significant drawback is that the incoming reactant gases disperse when traveling such a large distance between their point of introduction and the rotating substrate. With such dispersion, an appreciable volume of the reactant gases bypass the substrate around the substrate edges and exit the reaction chamber without reacting at the substrate surface. For example, FIG. 1 shows various streamlines 5 of a downward and outward reactant gas flow within a CVD reaction space 7 which houses a substrate 8 which rotates on a rotating susceptor 6. The streamlines 5 are from gas rings and a gas-dispersing showerhead (not shown) spaced approximately 4 inches or more above susceptor 6 and substrate 8. The streamlines 5 illustrate what occurs when such a large spacing is used between the gas-dispensing rings and showerhead and the rotating substrate 8. As may be seen, the average size of the boundary layer, indicated generally by reference numeral 10, is fairly significant and a substantial amount of the reactant gases 5 bypass rotating substrate 8 and pass around the baffle 11 to be exhausted out of the reaction space 7 by an appropriate exhaust system (not shown). The significant bypassing of the gases 5 lowers the deposition rate because there is a reduced density of reactants available at the substrate surface 12 for the surface reaction. Furthermore, the wide boundary layer of reactant gases 5 at the substrate surface 11 affects the uniformity of the film deposited on substrate 8. Still further, the wasted, unreacted gases which are exhausted make the overall deposition technique inefficient and costly.

Another drawback to the large spacing between the gas dispensing and dispersing structures and the rotating substrate is the inability to ignite a sufficiently dense plasma proximate the substrate. Specifically, in PECVD techniques, it is desirable to generate a reactant gas plasma close to the substrate so that a sufficient density of activated plasma particles are present to provide energy to the surface reaction. Particularly, a concentrated plasma is necessary for low-temperature PECVD of titanium-containing films as disclosed in the U.S. patent application entitled "Method And Apparatus For Producing Thin Films By Low Temperature Plasma-Enhanced Chemical Vapor Deposition Using A Rotating Susceptor Reactor" which is being filed on the same day herewith. However, igniting a suitably dense plasma proximate the rotating substrate while maintaining a steady state gas flow to the plasma has not been satisfactorily achieved with current apparatuses utilizing gas rings and showerheads spaced four (4) or more inches from the rotating substrate.

Therefore, it is an objective of the present invention to disperse the reactant gases at substrate surface such that there is a small boundary layer and sufficient densities of the gases at the substrate surface while maintaining a steady state gas flow to the substrate. Further, it is an objective to produce a dense plasma at the substrate surface such that the plasma is sufficiently concentrated at the substrate surface to yield deposition of a PECVD film.

SUMMARY OF THE INVENTION

In accordance with the above objectives, the invention provides apparatuses and methods for dispersing reactant gases close to a rotating substrate in a CVD reaction chamber such that there is improved reactant gas flow over the surface of the substrate and a reduced boundary layer for more efficient and uniform deposition and gas utilization. Further, the present invention produces a concentrated plasma at the rotating substrate to produce PECVD films particularly for PECVD of a titanium-containing film at low temperatures.

The present invention utilizes a gas-dispersing showerhead positioned within one inch of a rotating substrate. The showerhead is spaced a suitable distance below a gas-dispensing ring or other dispensing apparatus such that a steady state flow of gas develops between the ring and the showerhead before being disbursed by the showerhead over the rotating substrate. The showerhead is positioned within one inch of the substrate and preferably within 20 mm to produce a small gas boundary layer at the substrate for more efficient and more uniform deposition of a CVD film.

In one embodiment, a cylindrical structure or cylinder extends between a gas-dispensing ring which is coupled to a reactant gas supply and the showerhead. The reactant gases are dispensed into the cylinder at one end spaced away from the substrate and flow down the length of the cylinder to be dispersed over the rotating substrate surface by the gas-dispersing holes in the showerhead. The velocity profile of the flow of incoming reactant gases develops within the length of the cylinder and the cylinder confines the reactant gases such that preferably the reactant gases flow to the substrate surface only through the gas-dispersing showerhead. The close spacing of the showerhead, as well as the steady state flow of the gases reduces the boundary layer over the substrate and ensures an efficient and uniform deposition of a CVD film on the substrate surface. The shape of the showerhead and the dimension of the gas-dispersing holes, which are preferably $\frac{1}{32}$ (0.0313) of an inch, flattens the velocity profile of the gases over the substrate to further produce a uniform gas flow to the substrate. Close spacing of the showerhead and the reduced boundary layer yields more efficient CVD with less of the reactant gases bypassing substrate.

In accordance with another feature of the present invention, the showerhead is biased with RF energy to create an RF electrode for use in PECVD. Plasma gases pass through the RF showerhead/electrode and are excited proximate the showerhead/electrode to form a concentrated plasma close to the substrate which supplies energy to the surface reaction during PECVD (the showerhead will be referred to as a showerhead/electrode throughout the application where appropriate). The reduced spacing, i.e., less than 1 inch, between the showerhead/electrode and the substrate and the improved gas flow of the present invention ensure a concentrated plasma at the substrate surface which yields sufficient energy for the deposition of a film according to PECVD techniques. Additionally, the showerhead/electrode evenly disperses the reactant gases such that the concentrated plasma is uniform over the entire substrate surface. The cylinder and showerhead/electrode of the present invention prevent ignition of a plasma above the showerhead/electrode and inside the cylinder, or even in the dispersing holes of the showerhead/electrode. In that way, the plasma is generally concentrated below the showerhead/electrode to enhance deposition and prevent contaminants within the plasma.

In one embodiment of the present invention, the cylinder is made of nickel-plated aluminum and is coupled to a solid nickel showerhead/electrode by a quartz insulating ring. The insulating ring electrically isolates the cylinder from the RF showerhead/electrode to prevent ignition of plasma in the cylinder. In another embodiment, the entire cylinder is made out of an insulative quartz material to prevent formation of a plasma within the cylinder. The showerhead may be approximately 0.25 inches thick and generally may have from 200 to 1,200 gas-dispersing holes depending upon the diameter of the showerhead and the substrates to be processed. The dispersing holes of the showerhead/electrode are preferably $\frac{1}{32}$ (0.0313) of an inch to further ensure that the plasma is confined below the showerhead/electrode. A preferred embodiment for processing six inch diameter substrate wafers employs a circular showerhead with an approximately 6.5 inch diameter area having 300 to 600 gas dispersing holes. As may be appreciated, dimensions of the cylinder, showerhead and holes may be adjusted depending upon, among other factors, the size of the chemical vapor deposition chamber, the desired showerhead distance from the substrate and the size of the substrate being processed.

The cylinder and showerhead/electrode of the present invention is operable to deliver approximately 200 to 300 watts of power at RF frequencies as low as 450 KHz and as high as 13.56 MHz. Additionally, the present invention operates sufficiently with reactant gas flow rates between 50 and 50,000 sccm, as well as susceptor rotation rates between 0 and 2,000 rpm.

The invention and the particular advantages and features of the present invention will now be described in further detail below with reference to the accompanying drawings.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION OF THE INVENTION

Figure 1:
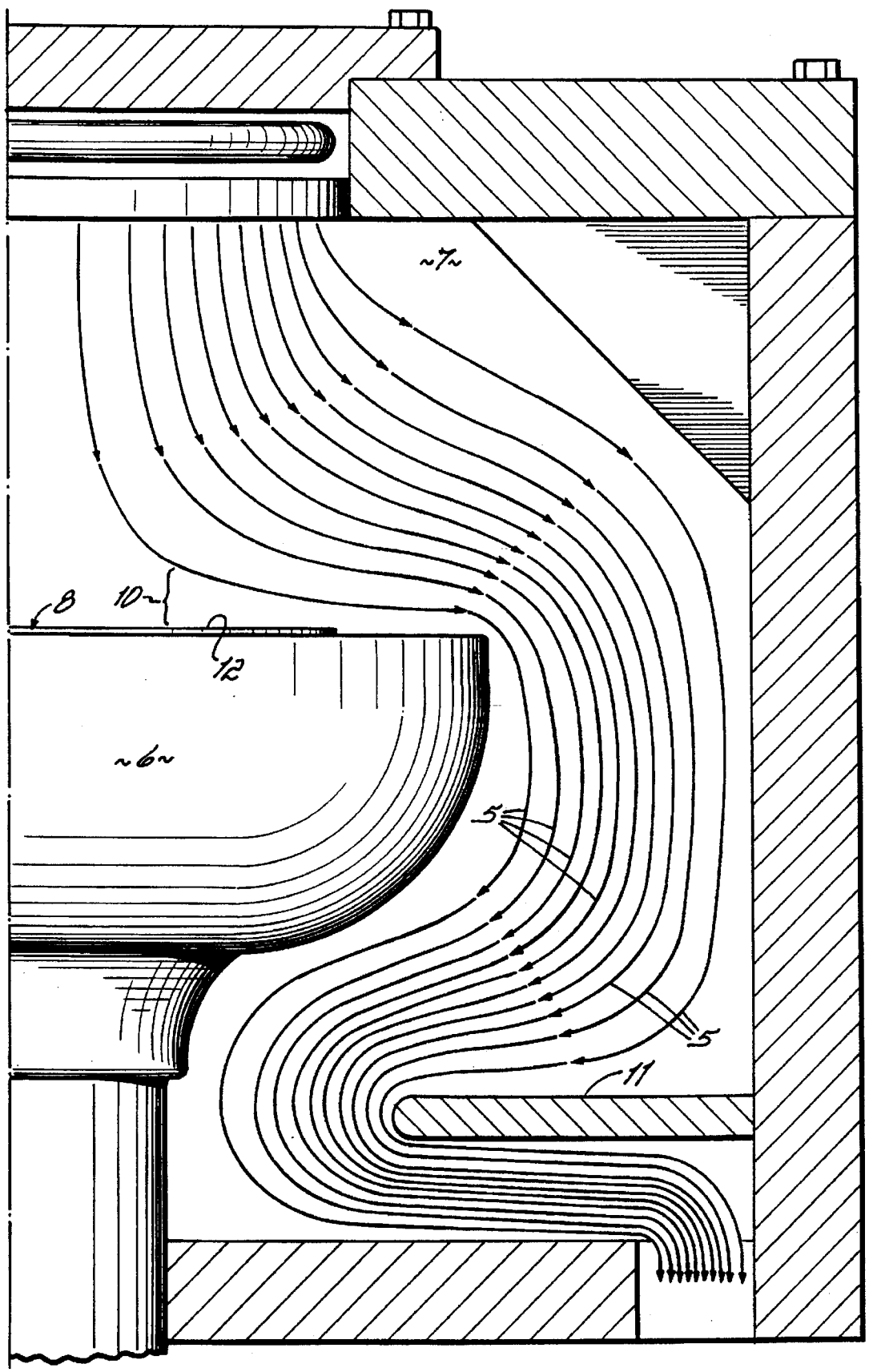
FIG. 1 is a diagrammatic cross-sectional view of an example gas flow profile in a CVD reaction chamber with a rotating susceptor which does not utilize the present invention.
Figure 2:
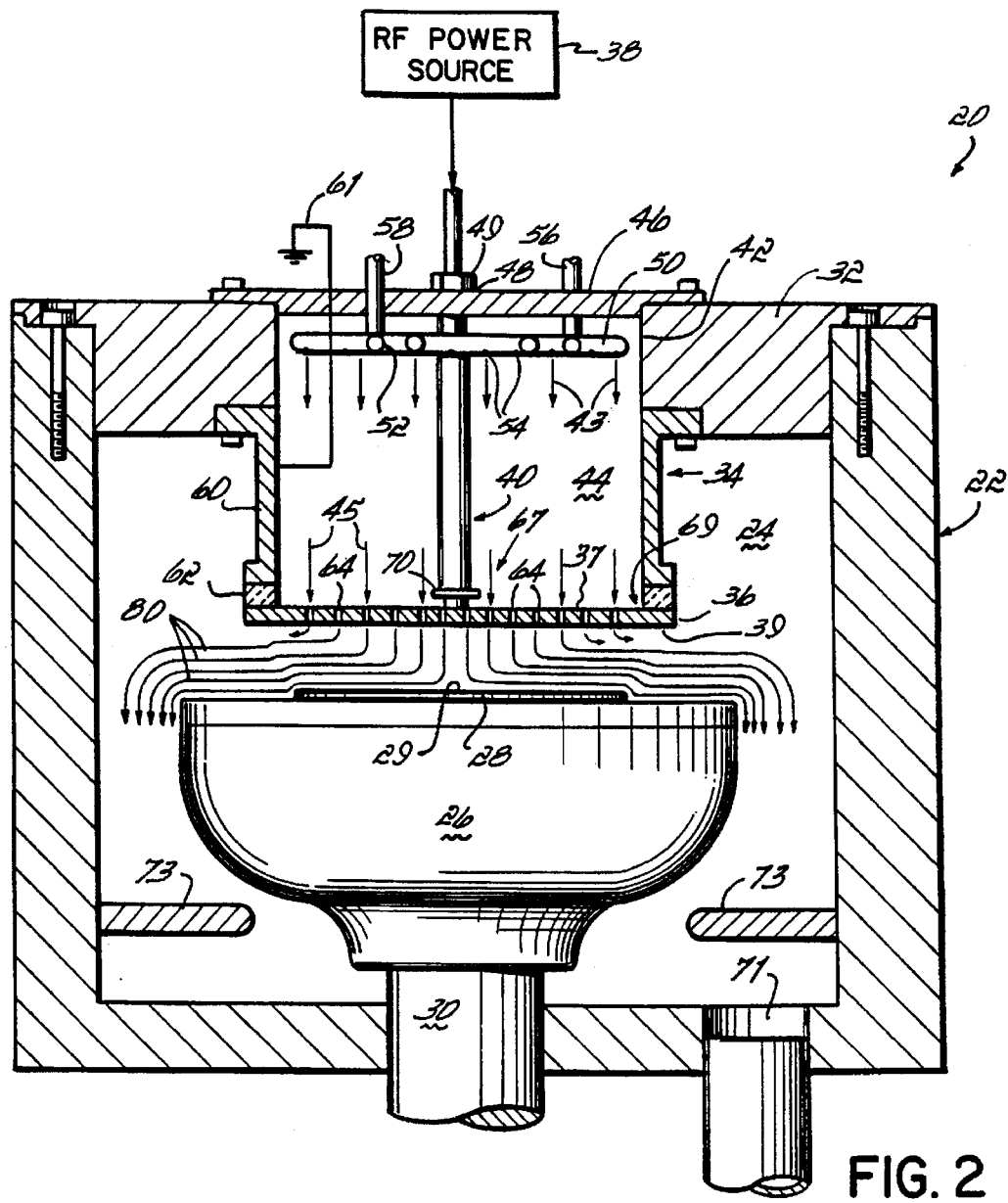
FIG. 2 is a cross-sectional view, of an embodiment of the present invention.

By virtue of the foregoing and in accordance with the principles of the present invention, FIG. 2 illustrates one embodiment of the present invention. A CVD reactor 20 includes a deposition chamber housing 22 which defines a reaction or deposition space 24 therein. A rotating susceptor 26 supports a substrate or wafer 28 within reaction space 24. A reactor suitable for the purposes of the present invention is a Rotating Disk Reactor available from Materials Research Corporation (MRC) of Phoenix, Ariz. The reaction or deposition space 24 within housing 22 may be selectively evacuated to various different internal pressures, for example, from 0.5 to 100 Torr. The susceptor 26 is coupled to a variable speed motor (not shown) by shaft 30 such that the susceptor 26 and substrate 28 may be stationary or may be rotated at various speeds such as between 0 and 2,000 rpm. When rotating, susceptor 26 creates a downward pumping action in a direction generally perpendicular the substrate surface 29. Susceptor 26 is also heated by a suitable heating mechanism (not shown) coupled to the susceptor 26 so that susceptor 26 may heat substrate 28, such as between 200° and 800° C.

Extending downwardly from the cover 32 of housing 22 is a cylinder assembly 34 which supports a gas-dispersing showerhead 36 above rotating susceptor 26 and substrate 28. The cylinder assembly 34 preferably positions showerhead 36 within 1 inch of substrate 28 and more preferably within 20 mm of substrate 28. The cylinder assembly 34, in combination with a generally circular opening 42 formed in the cover 32, forms a vertical flow passage which extends in the direction of reference arrows 43 between a gas distributor cover 46 and showerhead 36. Opening 42 of cover 32 forms a cylinder concentric with cylinder assembly 34 to define a generally cylindrical flow passage 44. As discussed further hereinbelow, showerhead 36 may be coupled to an RF power source 38 such as by an appropriate RF feedline assembly 40 which extends through an opening 48 in the gas distributor cover 46. RF feedline assembly 40 is used to bias showerhead 36 so that it acts as an electrode for PECVD techniques as explained in greater detail below. A sealing structure 49 seals the opening 48 around feedline assembly 40. Plasma and reactant gases are introduced into vertical flow passage 45 by concentric gas rings or halos 50, 52. As will be appreciated, other gas-dispensing structures might be utilized as are known by a person of ordinary skill in the art. The concentric rings 50, 52 are coupled to appropriate gas supplies (not shown) through lines 56, 58, respectively and the rings include a number of gas-dispensing holes 54 which evenly dispense the gases around the perimeter of flow passage 44. Showerhead 36 includes gas-dispersing holes 64 for dispersing reactant gases over substrate 28.

Cylinder assembly 34 includes a cylinder 60 and an insulator ring 62 which electrically separates cylinder 60 and showerhead 36 whenever showerhead 36 is biased with RF energy. Cylinder 60 is preferably electrically grounded by ground line 61. The insulator ring 62 is preferably dimensioned in diameter and width as indicated by reference numeral 63 to ensure complete electrical separation between cylinder 60 and showerhead 36 along the entire attachment interface between the cylinder 60 and showerhead 36 (see FIG. 4). The insulator ring may be made of quartz material such as Quartz T08-E available from General Electric and in one embodiment the ring has a thickness of approximately 0.75 inches.

In use, CVD reactant gases are introduced at the top of flow passage 44 through rings 50, 52, and the gases are drawn generally downwardly in the direction of arrows 43 by the downward pumping action of rotating susceptor 26. The showerhead 36 is preferably spaced from 2 to 4 inches from the rings 50, 52 to ensure a steady state flow of the gases at showerhead 36. More specifically, as the reactant gases flow downwardly through flow passage 44, a velocity profile develops. The velocity profile is a measurement of gas velocities at various points in the gas flow as measured across the gas flow perpendicular to the flow direction 43. Generally, the velocities across the gas flow at the top of the flow passage 44 near rings 50, 52 are generally equal. However, at the bottom of flow passage 44, generally above the top surface 37 of showerhead 36, the velocity profile of the gas flow, indicated by arrows 45, has reached a steady state. At steady state the velocity of the reactant gas flow is generally greater in the center 67 of the showerhead 36 than it is at the periphery 69 of showerhead 36. Showerhead 36 flattens out the velocity profile of the reactant gas flow across the bottom surface 39 of the showerhead such that below showerhead 36 proximate substrate 28 the flow velocity near the center 67 of showerhead 36 is generally equal to the flow velocity at the periphery 69 of the showerhead 36.

Figure 3:
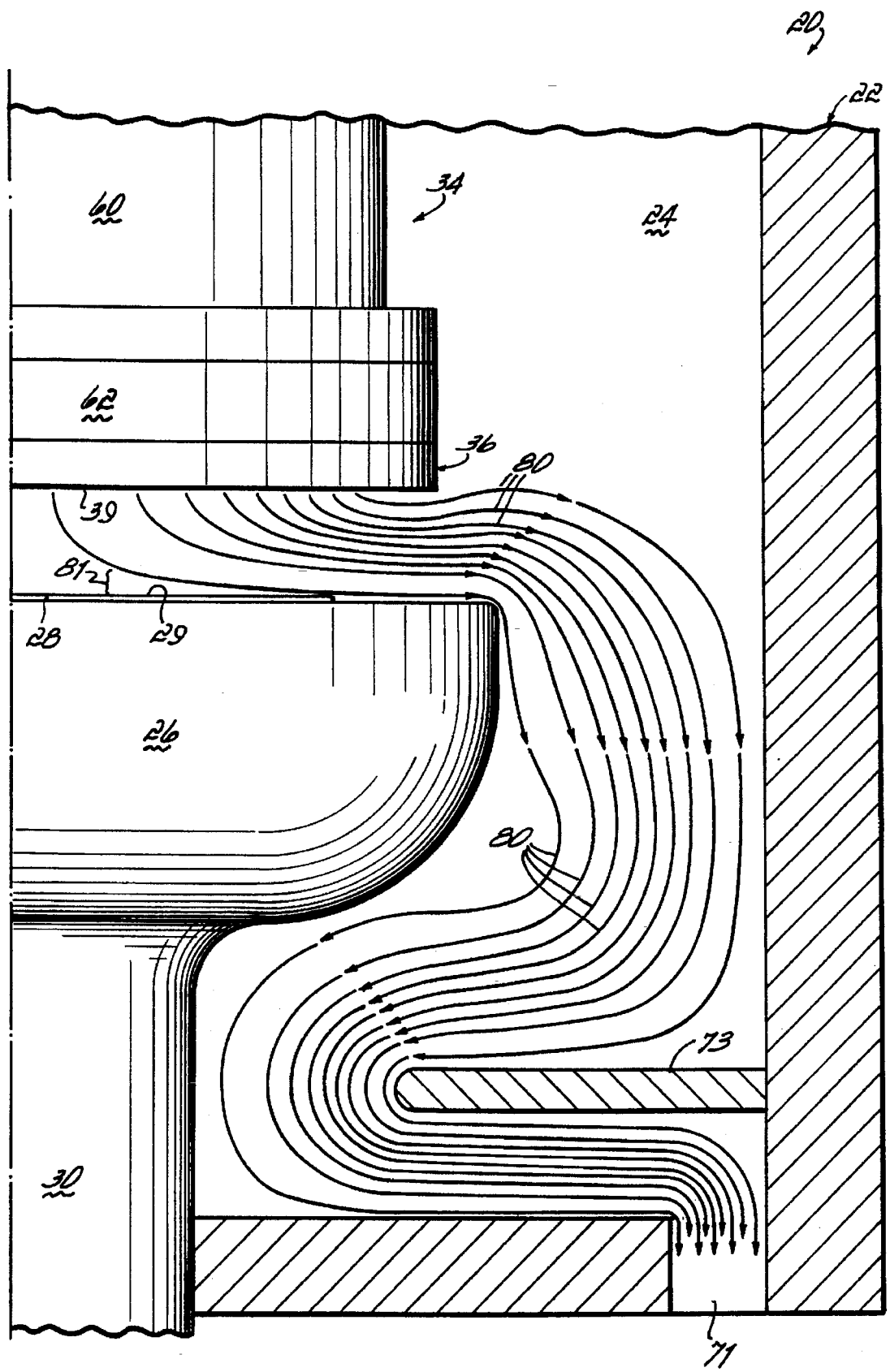
FIG. 3 is a diagrammatic cross-sectional view of an example gas flow profile in a CVD reaction chamber using the present invention.

The spacing between the rings 50, 52 and showerhead 36 provided by cylinder assembly 34 and flow passage 44, and one inch or less spacing between showerhead 36 and rotating substrate 28 achieved by the present invention yields uniform gas flow over the top surface 29 of substrate 28 with a very thin boundary layer. As shown in FIG. 3, utilizing the 1 inch or less showerhead spacing of the present invention the streamlines of reactant gas flow 80 are held much closer to the substrate 28. The boundary layer height as indicated by reference numeral 81 is effectively reduced, and thus, there is a greater density of reactant gases present at the substrate surface 29 to take place in the chemical vapor deposition of a film. This ensures that a greater percentage of reactant gases are utilized in the CVD reaction, and therefore, a smaller percentage of the reactant gases bypass the substrate 28 unreacted to be exhausted by vacuum opening 71 around baffle 73 and out of the reaction space 24.

Figure 8:
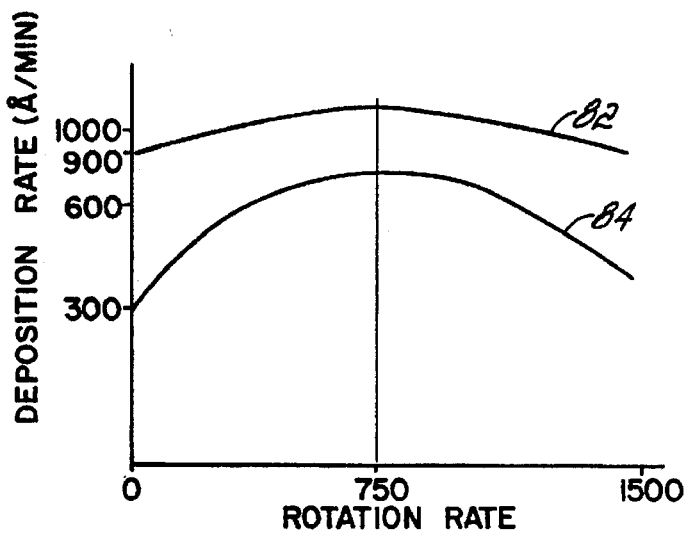
FIG. 8 is a graphical illustration of the deposition ram versus rotation rate for a CVD reaction with and without the present invention.

As discussed above, the reactant gas flow through flow passage 44 is drown downwardly and through showerhead 36 by the downward pumping action of the rotating susceptor 26. An increased susceptor rotation rate produces an increased deposition rate because an increased quantity of reactants are being pumped to the surface. This is termed the rotating disk effect. The process curves in FIG. 8 illustrate that the rotating disk effect occurs for the reduced showerhead-to-susceptor spacing achieved by the present invention. That is, as the rotation rate of the susceptor 26 increases, the deposition rate increases indicating that a greater quantity of reactants is being pumped to the surface 29 of substrate 28. A maximum deposition rate is reached whenever the incoming and downward gas flow to the substrate is equal to the outward flow of gas away from the substrate. Such a condition is generally referred to as matched gas flow. In the present invention, it is preferable to utilize matched gas flow. Further discussion of matched gas flow is disclosed in the pending application entitled, "A Method For Chemical Vapor Deposition Of Titanium-Nitride Films At Low Temperatures", Ser. No. 08/131,900, filed Oct. 5, 1993, which application is incorporated herein by reference.

At susceptor rotation rates which pump the gas downwardly at a rate higher than the rate at which it can be carried away from the substrate, i.e., unmatched flow, the deposition rate drops because recirculations and backflow of the gas develop at the substrate surface. In FIG. 8, the deposition rate curve for one embodiment of the present invention, indicated by reference numeral 82, shows higher deposition rates than the curve achieved without the present invention which is indicated by reference numeral 84. Curve 82 indicates that less of the reactant gases are bypassing the wafer surface 29 in the present invention, and consequently, more are participating in the surface CVD reaction. Furthermore, curve 82 is flatter than curve 84 which indicates an improved process stability over a wider range of rotation rates when using the present invention In accordance with another feature of the present invention, the showerhead 36 may be biased with RF energy to function as an RF electrode for PECVD techniques. When plasma gases, such as $H_2$, $N_2$ and $NH_3$, are introduced, such as through rings 50, 52 they are excited into a plasma by showerhead/electrode 36 preferably below the showerhead/electrode 36 and not within cylinder 60. The approximate 1 inch or less spacing between the RF showerhead/electrode 36 and substrate 28 creates a very concentrated plasma near substrate 28 which is useful for low temperature PECVD, and particularly for low temperature PECVD of titanium-containing films. Specific uses of the present invention are illustrated in a co-pending application entitled "Method and Apparatus for Producing Thin Films by Low Temperature Plasma-Enhanced Chemical Vapor Deposition Using a Rotating Susceptor Reactor", filed on the same day herewith and which is completely incorporated herein by reference. Several examples of use of the embodiments of the present invention are given below. The terms "showerhead 36" and "showerhead/electrode 36" will be used interchangeably throughout this application to designate a similar structure for non-RF electrode and RF electrode features of the present invention, respectively.

Figure 4:
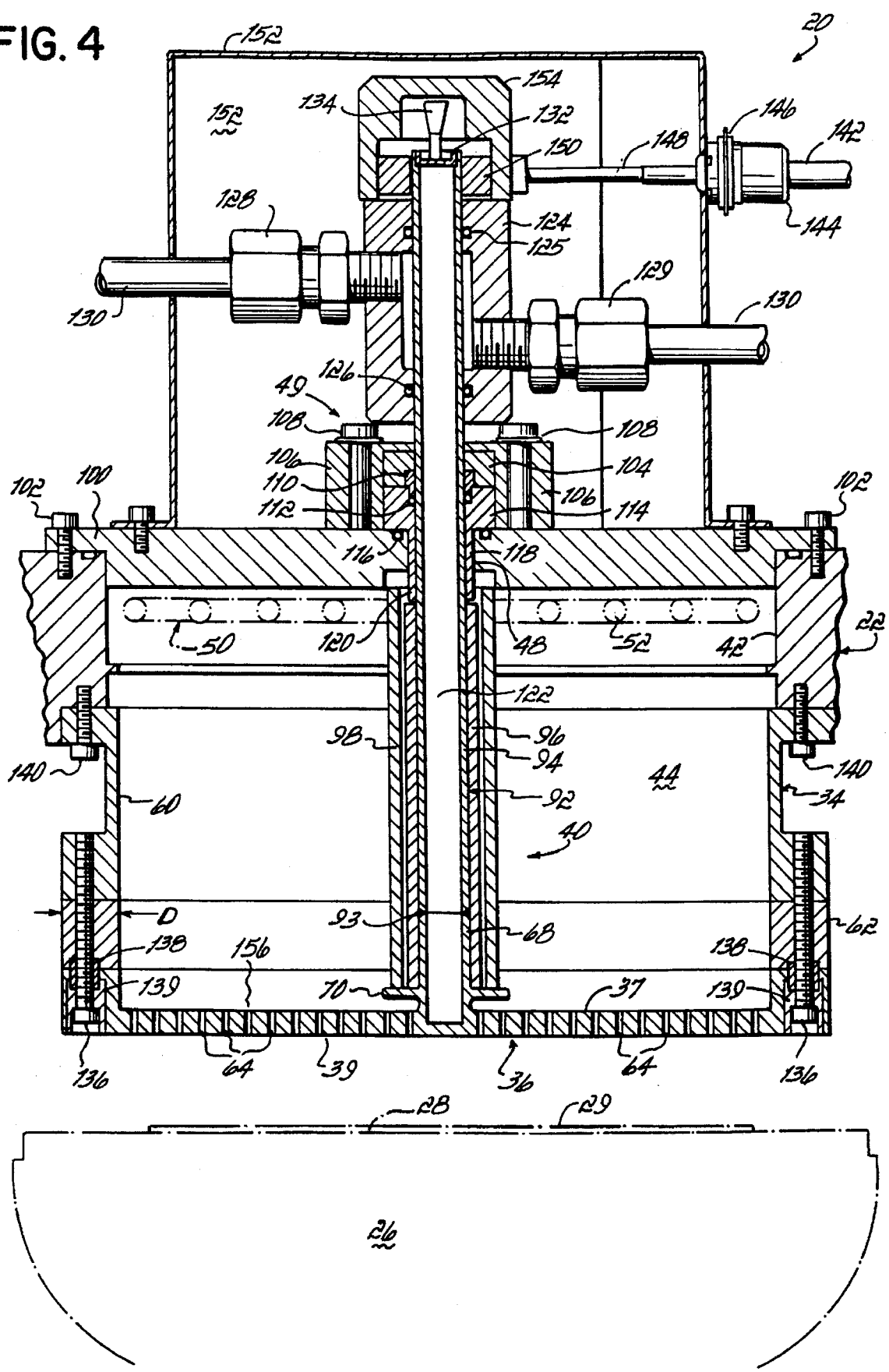
FIG. 4 is a detailed view of the embodiment of the present invention illustrated in FIG. 2.

More specifically, RF power source 38, through RF feedline assembly 40, biases showerhead/electrode 36. The electrically grounded susceptor 26 forms another parallel electrode. An RF field is created preferably between showerhead 36 and susceptor 26 and the RF field excites the plasma gases which are dispersed through holes 64 so that a plasma is generated generally below showerhead/electrode 36. It is preferable that the plasma is created below the showerhead/electrode 36 and not within the flow space 44 above the showerhead/electrode 36. It is further preferable that the plasma is not created within dispersion holes 64 but rather is confined below the bottom surface 39 of showerhead/electrode 36. Thus, the dispersion holes 64 are dimensioned so that the generated plasma is preferably confined below surface 39 of showerhead/electrode 36. In one embodiment of the present invention, the diameter of the dispersing holes 64 is 1/32 of an inch. Furthermore, other features of the present invention ensure that the generated plasma is concentrated below the showerhead/electrode 36. For example, insulator sleeves 96, 98 are utilized within the RF feedline assembly 40 to insulate the RF line from the metal of cylinder 34 and housing 22 as illustrated in FIG. 4 and discussed in greater detail below. Additionally, quartz insulator ring 62 electrically separates the showerhead/electrode 36 from cylinder 34 to further confine the plasma below showerhead/electrode 36. The rotation of susceptor 26 and accompanying pumping action and the flow of gases within cylinder assembly 34 and flow passage 44 ensures a uniform flow of gases to the plasma for uniformly sustained plasma and uniform deposition.

With PECVD according to the principles of the present invention, a reactant gas, such as $TiCl_4$, is also introduced into flow passage 44 such as through a gas ring similar to rings 50 and 52, although the plasma gases and the reactant gases are preferably introduced through different rings. The gas particles of the reactant gases are also excited by the RF field generated by showerhead/electrode 36 and susceptor 26 but do not form what would be defined as a plasma. Therefore, a mixture of excited reactant gas particles and a plasma of the plasma gas particles are concentrated above substrate 28 and preferably within 1 inch of the substrate in accordance with the principles of the present invention.

The RF showerhead/electrode 36 may be excited with RF energy having a frequency in the range of, for example, 450 KHz to 13.56 MHz, and the invention does not seem to be particularly frequency sensitive. The generation of a uniform plasma within 1 inch or less of substrate 28 yields a high density of useful plasma gas radicals and ions proximate the substrate surface 29. The pumping action of the susceptor draws the plasma particles and excited reactant gas particles to the substrate to react and form a film. Generally, a substrate rotation rate somewhere between 0 and 2,000 rpm might be utilized with the RF showerhead/electrode of the present invention. However, no rotation, i.e., 0 rpm, although not drastically affecting the deposition rate, seems to lower the uniformity of the reactant and plasma gas flow and the subsequent deposition. A useful rotation rate for depositing titanium-containing films has been found to be around 100 rpm.

Since the showerhead/electrode 36 of the present invention generates a plasma containing radicals and ions of the plasma gases, the showerhead spacing and deposition parameters should preferably be chosen to achieve a useful mixture of radicals and ions at the substrate surface 29. While some ion bombardment of the substrate 28 is beneficial because it supplies additional energy to the growing film layer on the surface 29, too much ion bombardment of a substrate may damage the integrated circuit devices on a substrate. Furthermore, a high density of ions leads to poor film conformality as ions have a tendency to stick to contact and via surfaces. As discussed above, showerhead/electrode-to-susceptor spacing within 1 inch and preferably within 20 mm has proven useful.

FIG. 4 discloses an RF showerhead/electrode configuration similar to the configuration in the embodiment of FIG. 2 except in greater detail. Wherever possible similar reference numerals will be utilized between FIGS. 2 and 4. There is shown in section a portion of CVD deposition chamber housing 22, to which is mounted the RF showerhead/electrode assembly 34. The showerhead/electrode 36 includes an RF line stem 68 mounted thereto which is one of several components making up the RF feedline assembly 40 supplying RF energy to showerhead/electrode 36. The RF feedline assembly 40 also acts as a heat pipe to conduct heat away from showerhead/electrode 36 as is discussed in greater detail hereinbelow. Line stem 68 may be machined concentrically into and integral with the upper surface 37 of showerhead/electrode 36 to increase the RF signal conduction and heat conduction efficiency see FIG. 5). The RF feedline assembly 40 includes an RF line 92 which comprises line stem 68 and an additional length of tubing 94 welded thereto such as at 93 to achieve the desired overall length of the RF line 92 and to attach tubing 94 to the stem 68. The showerhead/electrode 36 and the integral line stem 68 may be made of Nickel-200, while RF line tubing 94 may be made of a highly conductive material such as 6061-T6 aluminum. However, it will be appreciated by persons skilled in the art that other materials can be used for the RF line tubing 94, such as Nickel-200. In one embodiment, the RF line tubing 94 is made of aluminum coated with an outer layer of nickel to prevent an RF plasma from forming within said cylinder 60 of the cylinder assembly 34 during use of the RF showerhead/electrode 36 according to the principles of the present invention.

Figure 5:
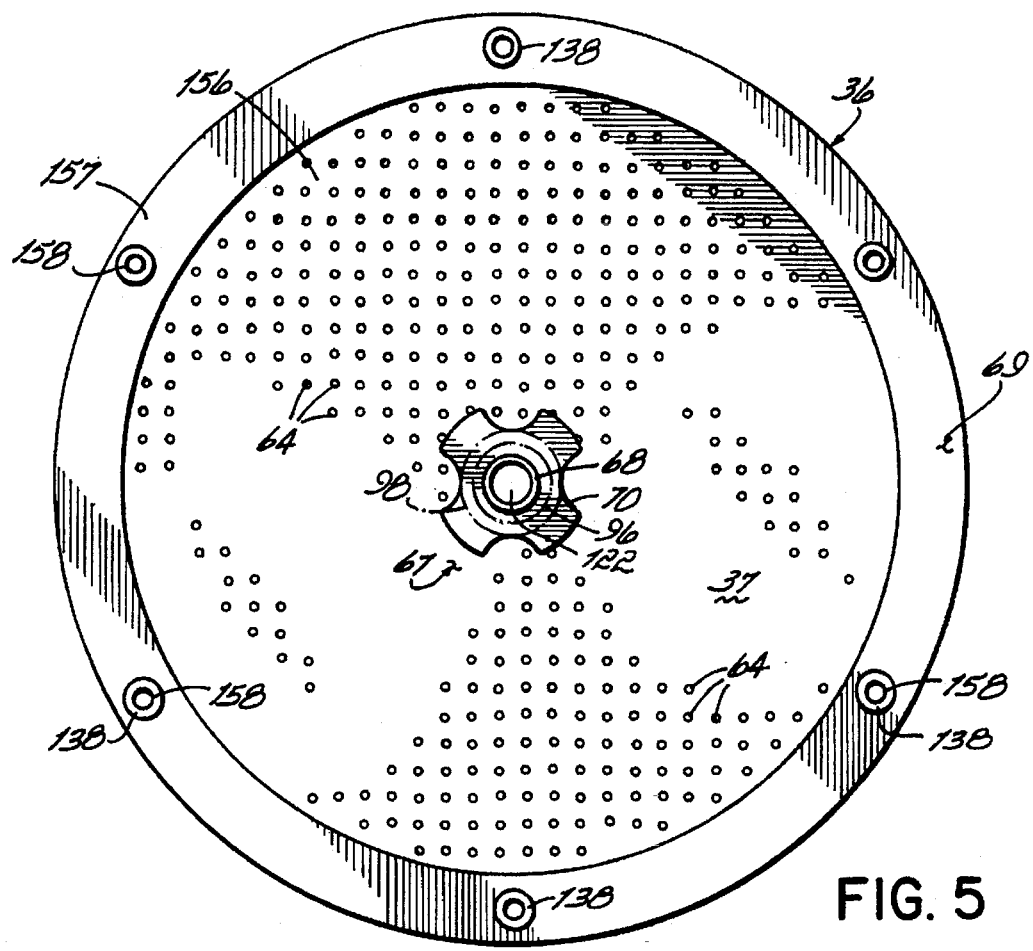
FIG. 5 is a top view of a gas-dispersing showerhead used with the embodiment of the present invention shown in FIGS. 2 and 4.

As already discussed, showerhead/electrode 36 is perforated with a pattern of gas dispersion holes 64 to distribute the reactant and plasma gases evenly during CVD processing. As shown in FIGS. 4 and 5, upstanding RF line stem 68 is provided with a circumferential shoulder flange 70 adjacent and extending generally parallel to showerhead/electrode 36. The flange 70 is spaced above showerhead/electrode upper surface 37 and permits the gas dispersion hole pattern to extend beneath the shoulder flange 70, thereby minimizing gas flow disturbances. Furthermore, the flange 70 aids in the conduction of the RF energy along line 92 to showerhead/electrode 36, assists in cooling showerhead/electrode 36, and provides mechanical support for ceramic isolator tubes 96, 98.

The RF showerhead/electrode assembly 34 of FIG. 4 further includes first and second ceramic isolator tubes 96, 98, respectively, which are concentric with and surround at least a portion of RF line 92. As shown, ceramic isolator tubes 96, 98 are supported by circumferential shoulder flange 70. Tubes 96, 98 may be formed of the ceramic alumina (99.7% $Al_2O_3$), which is readily commercially available, such as from Coors Ceramics of Golden, Colo. Isolator tubes 96, 98 prevent RF plasma from forming around the RF line 92 during CVD processing by isolating the metal RF line 92 from any of the plasma and reactant gases present within the cylinder 60. It is desirable to prevent the formation of a plasma within the cylinder 60 in order to concentrate the plasma below showerhead/electrode 36. Additionally, and as described more fully below, the isolator tubes 96, 98 operate to reduce and prevent electrical shorting between gas distributor cover 100 (which is at ground potential) and RF line 92 at the opening 48 where RF line 92 passes through gas distributor cover 100.

Gas distributor cover 100 is mounted to housing 22 by means of a plurality of screws 102. As shown in FIG. 4, gas injection rings or halos such as rings 50, 52 (shown in phantom in FIG. 4) are located slightly below gas distributor cover 100 to supply the CVD reactant and plasma gases to the inside of cylinder 60 as already discussed. Gas injection rings 50, 52 may be only two of a plurality of concentric rings for introducing numerous reactant gases into the cylinder 60. A seal assembly 49 prevents vacuum leaks at the opening 48 where RF line 92 passes through gas distributor cover 100. This assembly includes a shaft seal and a flange seal. As shown in FIG. 4, a ceramic seal plate 104 is pressed downwardly by two stainless steel clamps 106. Clamps 106 are biased against distributor cover 100 by spring washer/ screw assemblies 108 to obtain a predetermined downward force on the seal components to insure proper sealing, to accommodate tolerance stacks in the seal components, and to take up dimensional changes due to thermal expansion which may occur during CVD processing. Seal plate 104 presses downwardly on a stainless steel ferrule 110 which in turn presses down on an O-ring 112 seated in ceramic seal body 114. The downward force exerted by clamps 106 on seal plate 104 also forces seal body 114 downwardly against gas distributor cover 100, which compresses the O-ring 116 located between seal body 114 and gas distributor cover 100. It should be noted that seal body 114 has a downwardly extending annular flange 118 which surrounds RF line 92 over the entire length of it which passes through gas distributor cover 100. The lower end 120 of annular flange 118 extends downwardly to a point where it meets the inner ceramic isolator tube 96. As shown, the outer ceramic isolator tube 98 extends further upward than isolator tube 96, such that there is no direct line between gas distributor cover 100 and RF line 92. This prevents arcing when the RF line 92 is used to supply RF energy to showerhead/electrode 36.

Biasing of the showerhead/electrode 36 with RF energy in addition to the temperatures utilized in CVD techniques heats the showerhead/electrode 36 during use. To ensure proper operation, showerhead/electrode 36 is cooled, and to this end, the RF line 92 also functions as a heat pipe structure. With respect to heat pipe structures, such devices are known, per se, and in the present invention, the heat pipe structure is used to carry off heat from the showerhead/ electrode 36 generated by radiant energy from the heated susceptor 26, as well as by the RF energy applied to the showerhead/electrode 36. The center space 122 of RF line 92 is provided with a felt or other suitable capillary wicking material liner (not shown). Space 122 is sealed with a liquid (e.g., acetone) therein under its own vapor pressure that enters the pores of the capillary material wetting all internal surfaces of RF line 92. By applying heat at any point along the length of the RF line, the liquid at that point boils and enters a vapor state. When that happens, the liquid in the wicking material picks up the latent heat of vaporization and the vapor, which then is at a higher pressure, moves inside the sealed pipe to a cooler location where it condenses and re-enters the liner. Thus, the vapor gives up its latent heat of vaporization and moves heat from the "input" to the "output" end of the heat pipe structure. As a general frame of reference, heat may be moved along a heat pipe at a rate of approximately 500 mph.

With reference to the specific configuration utilized in FIG. 4, the "input" end of the heat pipe structure is the end of RF line 92 which is affixed to showerhead/electrode 36. The "output" end is the upper end of RF line 92 shown in the FIG. 4 which has a liquid-cooling jacket 124 sealed around it. The seal is effected by O-ring shaft seals 125 and 126. Cooling jacket 124 is preferably a polymeric material and is provided with TEFLON compression fittings 128 and 129 which connect TEFLON tubing 130 to cooling jacket 124. A suitable cooling liquid, such as water, flows through tubing 130 and cooling jacket 124 to carry heat away from RF line 92. This permits direct contact of the cooling liquid with the RF line 92 for efficient conduction of heat from the line 92. Additionally, with this configuration, at no time is the CVD reactor chamber exposed to the possibility of an internal coolant leak, nor is there any corrosive effect on metal tubing by RF carrying liquid. As stated, the fluid which passes through TEFLON tubing 130 and carries the heat away from the RF line 92 may be water, although a variety of fluids can be used depending on the heat to be conducted away from the line 92. RF line 92 also includes a cap 132 which is welded in place and has a fill tube 134 for filling the internal space 122 with the desired fluid. A suitable commercially available heat pipe may be obtained from Thermocore Inc., of Lancaster, Pa.

As discussed, cylinder 60 forms part of cylinder assembly 34 and mounts showerhead/electrode 36 to the housing cover 32. The cylinder 60 is dimensioned such that the showerhead/electrode 36 is positioned generally within 1 inch of susceptor 26 after taking into account the thickness of ring 62. Showerhead/electrode 36 is fastened to cylinder 60 by means of screws 136, which are preferably made of a material that does not corrode in the presence of an RF plasma. One such material is Hastelloy C-22, which is a trade name of Hanes International, of Kokomo, Ind. Suitable screws made of this material are available from Pinnacle Mfg. of Tempe, Ariz.

Insulator ring 62 electrically isolates showerhead/electrode 36 from cylinder 60. The insulator ring may be formed of quartz and preferably of a suitable quality quartz which has few and/or very small internal blemishes such as air bubbles. A suitable quartz material is Quartz T08-E available from Hereaus Amersil of Tempe, Ariz. The quartz may be machined to form a quartz ring approximately ¾ (0.75) inches thick and having diameter dimensions which match the dimensions of the cylinder 60 and showerhead/electrode 36 between which the insulator ring 62 is fixed. Screws 136, which are at ground potential, are isolated from the showerhead/electrode 36 by two interlocking ceramic isolator sleeves 138 and 139. Quartz ring 62, while insulating showerhead/electrode 36 from cylinder 60, is also used because of the significant resistance of quartz to thermal shock. This is important because the RF showerhead/electrode 36 below ring 62 becomes heated to a higher temperature, and more rapidly, than cylinder 60 above quartz ring 62, thus inducing thermal shock and stress in ring 62. Screws 140, which may be made of the same material as screws 136, are utilized to affix cylinder 60 to housing 22.

RF energy is conducted to showerhead/electrode 36 by RF feedline assembly 40 comprising stem 68 and tube 94. Isolator tubes 96, 98 are needed to electrically isolate and prevent arcing between tube 94 and any parts of the metal housing 22, including distributor cover 100. Furthermore, the apparatus includes a seal around tubing 94 at the location where it passes through distributor cover 100.

RF energy is supplied through a shielded RF supplying cable 142 which is connected to an RF power source 38 (shown in FIG. 2) and has a UHF connector 144 at one end. Connector 144 mates with another UHF connector 146, which in turn is coupled via a length of 12 gauge wire 148 to a stainless steel shaft collar 150 mounted at the upper end of RF line 92. The shaft collar 150 is in frictional contact with RF line 92. To that end, collar 150 may include opposing clam-shell clamps which may be tightened against one another by means not shown to firmly grip line 92. With this arrangement there is minimal resistance to the flow of RF current through line 92. The segment of RF line 92 which is exposed above shaft collar 150 is isolated from the grounded metal shielding 152 by a polymer cap 154. The apparatus is capable of delivering 250–300 watts of RF frequencies from 450 KHz to 13.56 MHz.

FIG. 5 discloses a top flew, of one showerhead design appropriate for the embodiment of the present invention shown in FIGS. 2 and 4. Showerhead 36 is generally circular and includes dispersion holes 64 generally throughout its entire area. Showerhead 36 may be approximately 8.0 inches in total diameter with an area 156 containing holes 64 having a diameter of 6.5 inches. As will be appreciated by a person of ordinary skill in the art, the diameter of the showerhead 36 and the hole area 156 will depend upon the size of the substrate wafers which are processed using the current invention. Showerhead 36 may have generally from 200 to 1,200 dispersion holes 64 and preferably for an 8.0 inch showerhead has from 300 to 600 holes for dispersing the gases. As discussed above, the inner diameter of the holes 64 is preferably 1/32 (0.0313) inches, to prevent a plasma from forming within the cylinder 60.

Showerhead 36 includes a peripheral edge section 157 with spaced openings 158 spaced around the periphery of showerhead 36 which receive screws 136 or other fasteners for connecting showerhead 36 to the quartz ring as shown in FIG. 4. As already shown, the showerhead 36 includes a stem 68 which forms flange 70. Stem 68 and flange 70 are formed integrally with showerhead 36 and form part of the RF line assembly 40 connected to showerhead 36. The showerhead, 36, including stem 68, is formed of an electrically conductive material and preferably is formed of Nickel-200. The showerhead 36 in one embodiment of the invention has a thickness dimension in the holed area 156 of preferably ¼ (0.25) inches.

The embodiments of the present invention as illustrated in FIGS. 2 and 4 have been utilized to deposit layers of titanium and titanium nitride at low substrate temperatures. Various examples of CVD and PECVD methods and use of the present invention are illustrated below. Deposition parameters are given for each example and the results of the deposition are illustrated in tables associated with particular parameters. Table 1 illustrates use of the apparatuses of the present invention to deposit a titanium nitride (TiN) layer on a substrate utilizing both nitrogen gas ($N_2$) and hydrogen gas ($H_2$) and titanium tetrachloride ($TiCl_4$).

Deposition Parameters for Table No. 1

$TiCl_4$ (sccm) 10

$H_2$ (sccm) 500

$N_2$ (sccm) 500

RF Power (watts) 250 @ 450 KHz

Reaction chamber Pressure (Torr) 1

Susceptor Rotation Rate (rpm) 100

Substrate Temp. (C.°) 400

Deposition Time (seconds) 180

TABLE NO. 1

| Results and Additional Parameters | WAFER NO. | | | | | | | | | |
|---|---|---|---|---|---|---|---|---|---|---|
| | 1 | 2 | 3 | 4 | 5 | 6 | 7 | 8 | 9 | 10 |
| TiN layer thickness (Å) | 825 | 1023 | 1221 | 1262 | 1227 | 1224 | 1141 | 1348 | 1400 | 1106 |
| Deposition Rate (Å/min) | 275 | 341 | 407 | 421 | 409 | 408 | 380 | 449 | 487 | 389 |
| Layer Resistivity ($\mu\Omega$-cm) | 1530 | 26864 | 4118 | 3108 | 855 | 4478 | 3982 | 4658 | 3449 | 4501 |
| Susceptor Temp (°C.) | 470 | 480 | 488 | 470 | 470 | 460 | 460 | 460 | 460 | 460 |

Wafers 1 and 2 of Table 1 were silicon, while the remaining wafers 3–10 were thermal oxide. Wafers 6–10 received a 250 Watt RF plasma anneal for 120 seconds at an $NH_3$ gas rate of 5000 sccm, at an internal pressure of 3 Torr (wafer 6 was done at 5 Torr), and the susceptor rotation rate of 100 rpm. Therefore, as may be seen, a layer of titanium nitride may be deposited at a substrate temperature approximately 400° C., which is substantially less than the temperatures required for traditional thermal CVD processes.

The example of Table 2 below was accomplished with the parameters of Table 1 except at a substrate temperature of 600° C., and a layer of TiN was deposited according to Table 2 using the deposition parameters below.

Deposition Parameters for Table No. 1

$TiCl_4$ (sccm) 10
$H_2$ (sccm) 500
$N_2$ (sccm) 500
RF Power (watts) 250 @ 450 KHz
Reaction Chamber Pressure (Torr) 1
Susceptor Rotation Rate (rpm) 100
Substrate Temp. (C.°) 600
Deposition Time (seconds) 180

TABLE NO. 2

| Results and Additional Parameters | WAFER NO. | | | | | | | |
|---|---|---|---|---|---|---|---|---|
| | 1 | 2 | 3 | 4 | 5 | 6 | 7 | 8 |
| TiN layer thickness (Å) | 657 | 822 | 740 | 768 | 767 | 765 | 773 | 910 |
| Deposition Rate (Å/min) | 219 | 274 | 247 | 263 | 256 | 255 | 258 | 303 |
| Layer Resistivity ($\mu\Omega$-cm) | 391 | 254 | 432 | 543 | 471 | 949 | 973 | 2710 |
| Susceptor Temp (°C.) | 650 | 650 | 650 | 650 | 650 | 650 | 650 | 650 |

Wafers 1 and 2 of Table 2 were silicon and wafers 3–8 were thermal oxide. An RF plasma, ammonia anneal was performed on substrate wafers 6–8 of Table 2 at a power lever of 250 Watts for 120 seconds, and an ammonia introduction rate of 5000 sccm, a pressure of 5 Torr and a 100 rpm rotation rate.

The apparatuses of the present invention as illustrated in FIGS. 2 and 4 have also been utilized to deposit a layer of pure titanium. Table 3 below sets forth the results and parameters of a deposition run which resulted in a deposited film of approximately 84% titanium on a thermal oxide wafer at 650° C. This was an excellent result for such low temperature chemical vapor deposition.

Deposition Parameters for Table No. 3

$TiCl_4$ (sccm) 10
$H_2$ (sccm) 500
RF Power (watts) 250 @ 450 KHz
Reaction Chamber Pressure (Torr) 1
Susceptor Rotation Rate (rpm) 100
Deposition time (sec) 2700
Substrate Temperature (° C.) 565

TABLE NO. 3

| Results and Additional Parameters | WAFER NO. 1 |
|---|---|
| Ti layer thickness (Å) | 1983 |
| Deposition Rate (Å/min) | 44 |
| Layer Resistivity ($\mu\Omega$-cm) | 929 |
| Susceptor Temp (°C.) | 651 |

The substrate wafer of Table 3 was not annealed with an ammonia plasma as discussed above.

In Table 4, the flow of $H_2$ was increased to 5000 sccm for wafers 1–4 and to 3750 sccm for wafers 5–9. The deposition pressure was increased to 5 Torr. For wafers 5–9, a flow of 0.5 standard liters per minute (slm) of Argon was utilized with the $A_2$ as a diluent. In Table 4, wafers 1–2 and 5–6 were silicon, while wafers 3–4 and 7–9 were thermal oxide.

Parameters for Table 4

$TiCl_4$ (sccm) 10
$H_2$ (sccm) 5,000 (wafers 1–4); 3,750 (wafers 5–9)
Argon (slm) 0.5 (wafers 5–9)
RF Power (watts) 250 @ 450 KHz
Reaction Chamber Pressure (Torr) 5
Susceptor Rotation rate (rpm) 100
Substrate Temp. (° C.) 565
Deposition time (sec) 300 (600 for wafer 9)

Susceptor Temperature (° C.) approximately 650

Reaction Chamber Pressure (Torr) 5

TABLE 4

| Results and Additional Parameters | WAFER NO. | | | | | | | | |
|---|---|---|---|---|---|---|---|---|---|
| | 1 | 2 | 3 | 4 | 5 | 6 | 7 | 8 | 9 |
| TiN layer thickness (Å) | 798 | 1076 | 43.4 | 89.5 | 912.2 | 1082 | 656.5 | 577.1 | 1302 |
| Deposition Rate (Å/min) | 159.0 | 215.0 | 9.1 | 17.9 | 182.5 | 216.5 | 131.3 | 115.4 | 130.2 |
| Layer Resistivity (µΩ-cm) | 53.84 | 32.66 | 216.1 | 377.1 | 89.23 | 25.7 | 212.7 | 211.3 | 170.1 |

Table 5 shows additional runs made with the increased $H_2$ flow and increase deposition pressure.

Deposition Parameters for Table No. 5

$TiCl_4$ (sccm) 10
$H_2$ (sccm) 3,750
Argon (slm) 0.5
RF Power (watts) 250 @ 450 KHz
Reaction Chamber Pressure (Torr) 5
Susceptor Rotation Rate (rpm) 100
Deposition time (sec) 300 (wafers 9–12 600 seconds)
Substrate Temperature (° C.) 565
Susceptor Temperature (° C.) 650

Susceptor Rotation Rate (rpm) 100

Deposition time (sec) 180

Substrate Temperature (° C.) approximately 400° C.

TABLE NO. 5

| Results and Additional Parameters | WAFER NO. | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| TiN layer thickness (Å) | 889.6 | 3994 | 510.3 | 458.6 | 466.2 | 385.6 | 347.8 | 263.3 | 792.5 | 948.8 | 749.7 | 714.4 |
| Deposition Rate (Å/min) | 177.9 | 79.9 | 102.1 | 91.7 | 93.2 | 77.1 | 69.6 | 52.7 | 79.3 | 94.9 | 75.0 | 71.4 |
| Layer Resistivity (µΩ-cm) | 54.03 | 35.71 | 233.4 | 274.1 | 281.0 | 280.1 | 545.1 | 489.1 | 314.1 | 203.5 | — | — |

The change in deposition pressure from 1 Torr to 5 Torr produced a more stable and symmetric plasma. Additionally, the increased hydrogen flow with the addition of a small flow of argon increased the stability of the plasma flow as well as the plasma intensity. An argon flow of 0–10 slm is preferable. Wafers 1–2 were silicon, while wafers 3–10 were thermal oxide. Wafers 11 and 12 were borophospho-silicate glass, available from Thin Films, Inc. of Freemont, Calif. None of the wafers of either Table 4 or 5 were annealed with an ammonia plasma anneal.

Table 6 shows additional deposition runs at a susceptor temperature of 450° C.

Deposition Parameters for Table No. 6

$TiCl_4$ (sccm) 5
$H_2$ (sccm) 3,750
Argon (slm) 0.3
RF Power (watts) 250 @ 450 KHz Susceptor Temperature (° C.) 450

TABLE NO. 6

| Results and Additional Parameters | WAFER NO. | | | | | | |
|---|---|---|---|---|---|---|---|
| | 1 | 2 | 3 | 4 | 5 | 6 | 7 |
| TiN layer thickness (Å) | 242 | 222 | 210 | 241 | 168 | 136 | 150 |
| Deposition Rate (Å/min) | 80.7 | 74.0 | 70.0 | 80.3 | 56.0 | 45.3 | 50.0 |
| Layer Resistivity (µΩ-cm) | 66.0 | 554.0 | 494.0 | 714.0 | 484.0 | 0.1 | 0.1 |

Wafers 1–4 were silicon, wafer 5 was thermal oxide, while wafers 6 and 7 were aluminum alloy containing aluminum silicon and copper. Runs 6 and 7 of Table 6 illustrate the viability of depositing a titanium-containing film on aluminum using the present invention. The deposition runs of Table 6 utilized a lower flow of reactant gas than the runs of Table 5, i.e., 5 sccm of $TiCl_4$.

The depositions runs of Table 7 were made at further reduced $TiCl_4$ flow rates. All of the wafers of Table 7 were thermal oxide. None of the wafers of Tables 6 or 7 were annealed with an RF ammonia Deposition Parameters for Table No. 7

$TiCl_4$ (sccm) wafers 1–2, 4 sccm; 3–4, 3 sccm; 5–6, 2 sccm; and wafer 7 at 1 sccm $H_2$ (sccm) 3,750

RF Power (watts) 250 @ 450 KHz

Reaction Chamber Pressure (Torr) 5

Susceptor Rotation Rate (rpm) 100

Deposition time (sec) 300 (wafers 1 and 2 at 180 and 240, respectively)

Substrate Temperature (° C.) approximately 400° C.

Susceptor Temperature (° C.) 450

TABLE NO. 7

| Results and Additional Parameters | WAFER NO. | | | | | | |
|---|---|---|---|---|---|---|---|
| | 1 | 2 | 3 | 4 | 5 | 6 | 7 |
| TiN layer Thickness (Å) | 89 | 132 | 158 | 149 | 158 | 166 | 107 |
| Deposition Rate (Å/min) | 30 | 33 | 32 | 32 | 32 | 33 | 21 |
| Layer Resistivity ($\mu\Omega$-cm) | 259 | 239 | 199 | 199 | 190 | 209 | 482 |

Figure 6:
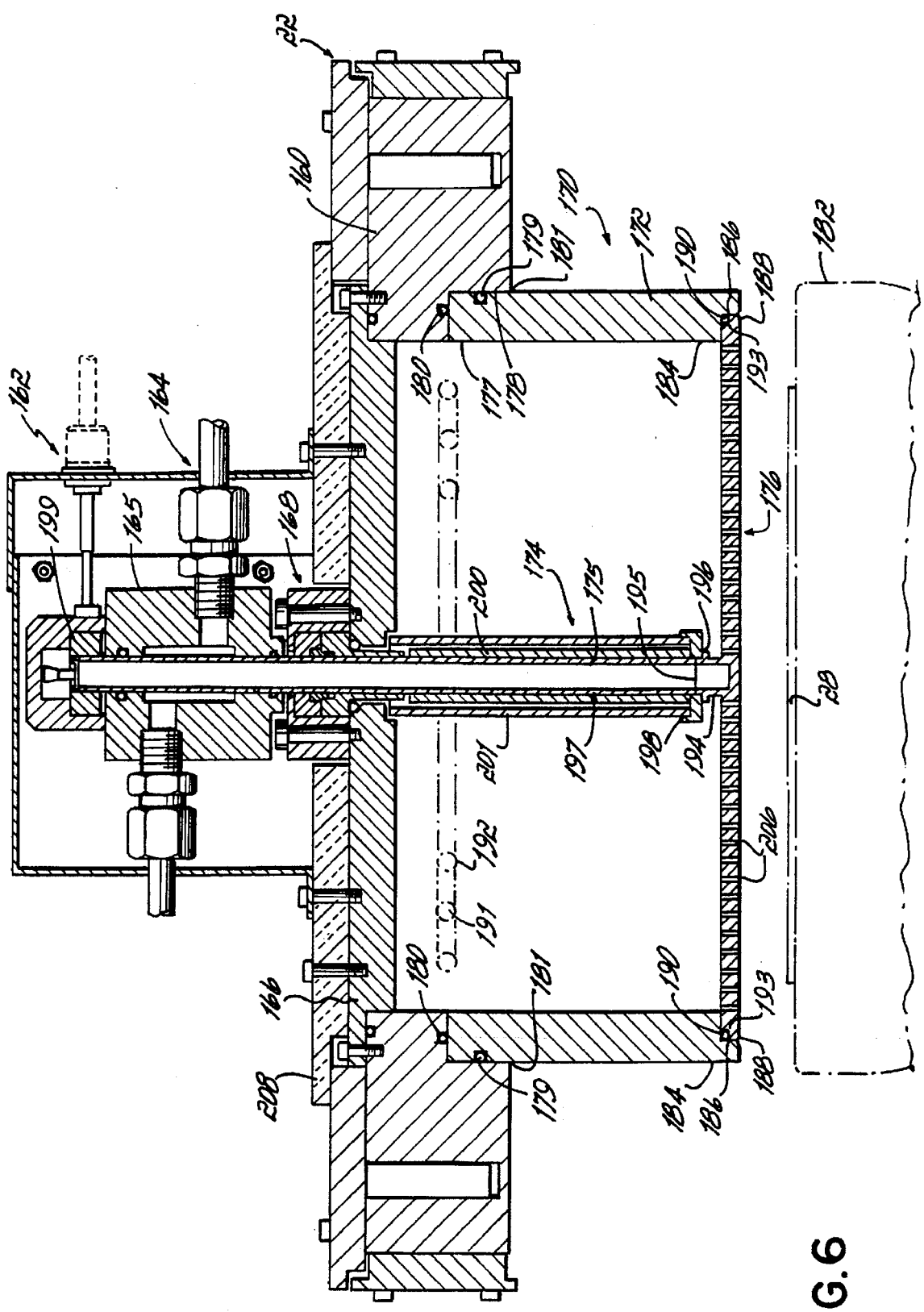
FIG. 6 is a cross-sectional view, of another embodiment of the present invention.

FIG. 6 shows an alternative embodiment of the present invention which eliminates the metal cylinder 60 and insulator ring 62 while preventing electrical arcing inside of the cylinder assembly proximate the RF line and preventing the undesired formation of plasma within the cylinder assembly when the showerhead is biased as an electrode. The embodiment of FIG. 6 utilizes a housing similar to housing 22 of FIG. 4 which includes a housing cover 160 and includes an RF supply assembly 162, a heat pipe assembly 164 with cooling jacket 165 and fluid supply lines and a gas distributor cover 166 with a sealing assembly 168 all generally similar to the respective components of FIG. 4. However, the cylinder assembly 170 does not include a metal cylinder 60 and insulator ring 62. Rather, a cylinder 172 made of insulating material such as quartz surrounds the RF feed line assembly 174.

Cylinder 172 is preferably formulated out of a high quality quartz such as Quartz T08-E available from Hereaus Amersil, as mentioned above. Quartz cylinder 172 is supported by a showerhead/electrode 176, made of a conductive metal such as Nickel-200, without the use of screws or other fasteners that are utilized within the embodiment of FIG. 4. Specifically, a stepped bore 178 is formed within housing cover 160 to receive an upper end 177 of cylinder 172. O-rings 179, 180 are placed at the interface 181 between stepped bore 178 and cylinder 172 to form a seal at interface 181. At the lower end 184 of cylinder 172, an annular notch 186 is formed in cylinder 172 to receive a peripheral edge 188 of the showerhead/electrode 176. The notch 186 of cylinder 172 rests upon the peripheral edge 188 of showerhead/electrode 176. Showerhead/electrode 176 includes a stem 194 which is attached to RF line tubing 175 such as by a weld at 195 to form a unitary RF line 197. RF line is frictionally held and supported at its top end by collar 199 similar to collar 150 of FIG. 4. The RF line, in turn, supports showerhead/electrode 176 above susceptor 182. Showerhead/electrode 176, in turn, supports the cylinder 172 within the cylinder assembly 170 by abutting against cylinder 172 at shelf notch and holding it in bore 178. The interface between showerhead/electrode peripheral edge 188 and cylinder notch 186 is sealed by a compressed O-ring 190 which is compressed between notch 186 and a corresponding annular notch 193 formed in peripheral edge 188. Similar to the embodiment of FIG. 4, a plurality of gas halos or rings 191,192 introduce the necessary plasma and reactant gases into cylinder 172.

The embodiment of FIG. 6 eliminates the need for metal screws to attach the cylinder 172 to the housing 160 and the showerhead/electrode 176 to the cylinder 172. This further reduces the possibility of arcing inside of cylinder 172 because of the reduced metal proximate the biased RF showerhead/electrode 176. Furthermore, it is not necessary to utilize ceramic isolator sleeves at the showerhead peripheral edge 188.

Figure 7:
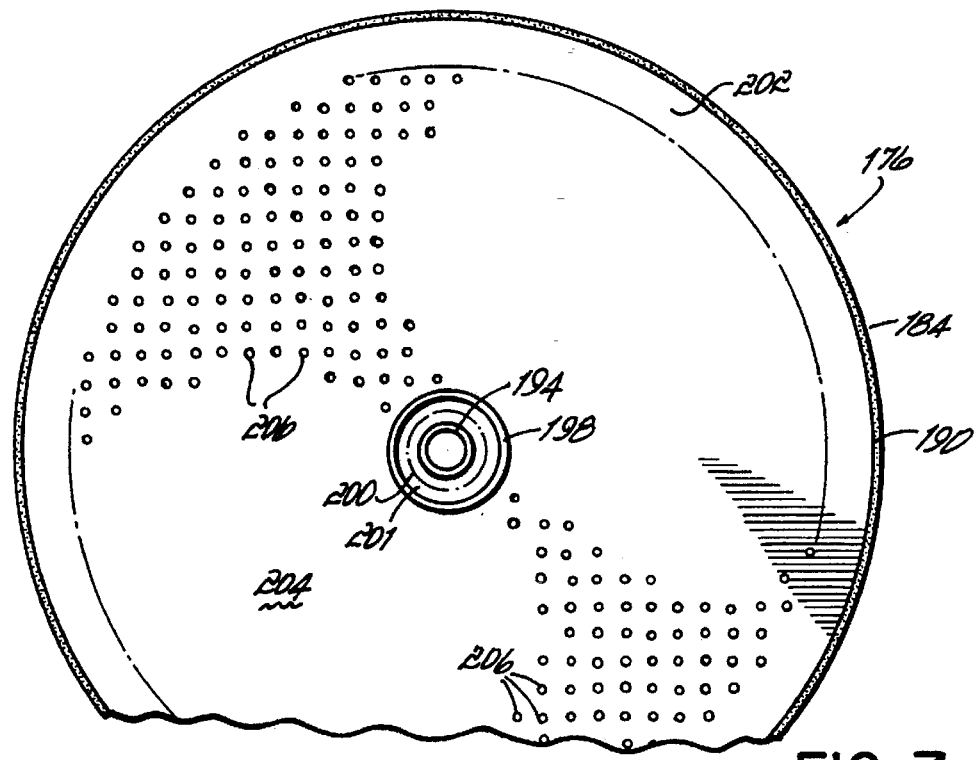
FIG. 7 is a top view of a gas-dispersing showerhead used with the embodiment of the present invention shown in FIG. 6.

Accordingly, the RF showerhead/electrode 176 has also been modified. As shown in FIGS. 6 and 7 showerhead/electrode includes a stem 194 without a flange. Instead, a slight ridge 196 is formed around stem 194, and as shown in FIG. 6, ridge 196 supports a generally circular ceramic tray 198 which is formed from a ceramic material similar to the ceramic isolator sleeves 94, 96 shown in FIG. 4. Ceramic tray 198 is supported by ridge 194, and in turn, supports isolator sleeves 200, 201. Isolator sleeves 200, 201 are also preferably made of a ceramic insulator material similar to sleeves 94, 96 of FIG. 4. Around the peripheral edge 188 of showerhead/electrode 176, shelf 193 is formed to receive O-ring 190 and seal the interface between cylinder 172 and showerhead/electrode 176 as discussed. Gas dispersion holes 206 are formed within an area 204 similar to the dispersion hole area 156 of the showerhead/electrode shown in FIG. 4. Preferably the holes are approximately 1/32 (0.0313) inches in diameter to prevent the formation of a plasma inside cylinder 172 to confine the plasma generally below the showerhead/electrode 176 and above the susceptor 182 as already discussed above. The embodiment of FIG. 6 utilizes cylinder 172 and eliminates the metal attachment screws proximate showerhead/electrode 176 which helps to prevent the formation of a plasma within cylinder 172 and to prevent arcing between the RF line 175 and showerhead/electrode 176 and any of the surrounding metal. A layer of insulation 208 may be placed atop gas distributor cover 166 to prevent contact by an operator, because the gas distributor cover 166 becomes very hot during operation.

While the present invention has been illustrated by the description of embodiments thereof, and while the embodiments have been described in considerable detail, it is not the intention of Applicants to restrict or in any way limit the scope of the appended claims to such detail. Additional advantages and modifications will readily appear to those skilled in the art. For example, the cylinder and showerhead utilized in one embodiment of the present invention might be fabricated from a different metal than disclosed. Furthermore, the non-conductive cylinder and ring in the various embodiments of the present invention might be fabricated of a material other than quartz. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. An apparatus for deposition of a film on a substrate inside a chemical vapor deposition chamber comprising:

a rotating susceptor to support and rotate said substrate inside said chamber, the rotating susceptor creating a pumping action toward the substrate;

a gas-dispersing showerhead opposite the susceptor and spaced about one inch or less from said susceptor and substrate and having holes to disperse reactant gases close to the rotating susceptor and said substrate so that the gases are drawn to said substrate by the susceptor pumping action;

a reactant gas supply element spaced from said gas-dispersing showerhead to supply reactant gas to be dispersed from the showerhead, the supply element being located at a position sufficiently spaced from the showerhead to create a generally linear reactant gas flow between the supply element and showerhead before the reactant gases are dispersed through the showerhead;

whereby to yield improved reactant gas flow over said substrate and a more efficient chemical vapor deposition of a film on said substrate.

2. The apparatus of claim 1 further comprising a hollow cylinder located between the supply element and the gas-dispersing showerhead and having a first end coupled to the supply element and a second end coupled to the gas-dispersing showerhead to contain the linear gas flow between the supply element and showerhead.

3. The apparatus of claim 1 further comprising an RF energy source coupled to the showerhead to bias the showerhead as an RF electrode, the RF showerhead electrode operable to excite reactant gas from said supply element to form a plasma for depositing a film on said substrate by plasma enhanced chemical vapor deposition.

4. The apparatus of claim 3 further comprising an RF line connecting the RF energy source to the showerhead electrode proximate the center of the showerhead electrode to uniformly bias the showerhead electrode.

5. The apparatus of claim 3 further comprising a hollow cylinder between the supply element and the gas dispersing showerhead electrode, the cylinder having a first end coupled to the supply element and a second end coupled to the showerhead electrode to contain the linear gas flow between the supply element and showerhead and produce a concentrated plasma proximate the susceptor and substrate.

6. The apparatus of claim 5 wherein the showerhead electrode is connected to the cylinder second end, the apparatus further comprising a non-conductive element coupled between the cylinder and showerhead electrode to prevent biasing of the cylinder with RF energy.

7. The apparatus of claim 6 wherein the non-conductive element is a ring connected between the cylinder second end and a peripheral edge of the showerhead electrode.

8. The apparatus of claim 3 wherein the holes of the gas-dispersing showerhead electrode are about 1/32 of an inch in diameter to confine the plasma to one side of said showerhead electrode between the susceptor and the showerhead electrode.

9. The apparatus of claim 4 further comprising a hollow cylinder between the supply element and the showerhead electrode, the cylinder having a first end coupled to the supply element and a second end coupled to the showerhead electrode to contain the linear gas flow between the supply element and showerhead electrode and produce a concentrated plasma proximate the susceptor and substrate, a potion of the RF line extending through said cylinder to the showerhead electrode.

10. The apparatus of claim 9 wherein the RF line includes a non-conductive covering over the portion of RF line extending through the cylinder to insulate the RF line section and prevent formation of a plasma within the cylinder.

11. The apparatus of claim 5 wherein the cylinder is formed of a non-conductive material to prevent biasing of the cylinder with RF energy.

12. The apparatus of claim 12 wherein the non-conductive material quartz.

13. The apparatus of claim 6 wherein the non-conductive element is formed of quartz.

14. An apparatus for plasma enhanced chemical vapor deposition of a film on a substrate inside a chemical vapor deposition chamber comprising:

a rotating susceptor to support and rotate said substrate inside said chamber, the rotating susceptor creating a pumping action toward the substrate within the chamber;

a gas-dispersing showerhead opposite the susceptor and spaced about one inch or less from said susceptor and substrate and having holes to disperse reactant gases close to the rotating susceptor and said substrate so that the gases are drawn to said substrate by the susceptor pumping action;

a reactant gas supply element spaced from the gas-dispersing showerhead to supply reactant gas to be dispersed from the showerhead, the supply element being located at a position sufficiently spaced from the showerhead to create a generally linear reactant gas flow between the supply element and showerhead;

a hollow cylinder located between the supply element and the showerhead, the cylinder having a first end coupled to the supply element and a second end coupled to the showerhead to contain the linear gas flow between the supply element and showerhead; and an RF energy source coupled to the showerhead to bias the showerhead as RF electrode operable to excite reactant gas from the supply element to form a plasma between the showerhead and rotating susceptor whereby to deposit a film on said substrate by plasma enhanced chemical vapor deposition.

15. The apparatus of claim 14 wherein the holes of the gas-dispersing showerhead electrode are about 1/32 of an inch in diameter to confine the plasma on one side of said showerhead electrode between the susceptor and the showerhead electrode.

16. The apparatus of claim 14 further comprising a non-conductive element coupled between the cylinder and showerhead electrode to prevent biasing of the cylinder with RF energy.

17. The apparatus of claim 16 wherein the non-conductive element is a ring connected between the cylinder second end and a peripheral edge of the showerhead electrode.

18. The apparatus of claim 14 wherein the cylinder is formed of a non-conductive material to prevent biasing of the cylinder with RF energy.

19. The apparatus of claim 18 wherein the non-conductive material is quartz.

20. The apparatus of claim 18 wherein the non-conductive element is formed of quartz.

* * * * *

UNITED STATES PATENT AND TRADEMARK OFFICE
CERTIFICATE OF CORRECTION

PATENT NO. : 5,628,829
DATED      : May 13, 1997
INVENTOR(S) : Robert F. Foster, et al It is certified that error appears in the above-identified patent and that said Letters Patent is hereby corrected as shown below:

Title page, item [73], delete "Materials Research Corporation, Gilbert,

Ariz." and insert Sony Corporation, Tokyo, Japan; Materials Research Corporation, Gilbert, Ariz.--.

In the abstract, line 17, delete "zquartz" and insert --quartz--.

In column 5, line 17, delete "ram" and insert --rate--.

In column 12, line 7, delete "flew" and insert --view--.

In column 17, last line of Table No. 7, under column heading 6, delete "209" and insert --208--.

In claim 9, column 20, line 4, delete "potion" and insert --portion--.

In claim 12, column 20, line 13, delete "12" and insert --11--.

In claim 12, column 20, line 14, after "material" insert --is formed of--.

Signed and Sealed this

Third Day of November, 1998

*Attest:*

BRUCE LEHMAN

*Attesting Officer*       *Commissioner of Patents and Trademarks*